(12) United States Patent
McCarthy et al.

(10) Patent No.: US 8,174,330 B2
(45) Date of Patent: May 8, 2012

(54) METHOD AND SYSTEM FOR AN ENERGY EFFICIENT TEMPERATURE SENSING CRYSTAL INTEGRATED CIRCUIT

(75) Inventors: Evan McCarthy, Costa Mesa, CA (US); John Walley, Ladera Ranch, CA (US)

(73) Assignee: Broadcom Corporation, Irvine, CA (US)

( * ) Notice: Subject to any disclaimer, the term of this patent is extended or adjusted under 35 U.S.C. 154(b) by 564 days.

(21) Appl. No.: 12/364,095

(22) Filed: Feb. 2, 2009

(65) Prior Publication Data
US 2009/0196323 A1   Aug. 6, 2009

Related U.S. Application Data

(60) Provisional application No. 61/025,724, filed on Feb. 1, 2008, provisional application No. 61/088,893, filed on Aug. 14, 2008.

(51) Int. Cl.
H03B 5/32   (2006.01)
(52) U.S. Cl. ............................. 331/66; 331/158; 331/176
(58) Field of Classification Search .............. 331/116 R, 331/116 FE, 158, 160, 176, 66, 185, 186; 702/99; 374/117
See application file for complete search history.

(56) References Cited

U.S. PATENT DOCUMENTS

| | | | |
|---|---|---|---|
| 4,641,109 A * | 2/1987 | Hiroshi | 331/116 FE |
| 5,185,610 A | 2/1993 | Ward et al. | |
| 5,594,453 A | 1/1997 | Rodal et al. | |
| 5,654,718 A | 8/1997 | Beason | |
| 5,874,864 A * | 2/1999 | Muto et al. | 331/66 |
| 6,160,458 A | 12/2000 | Cole | |
| 6,927,641 B2 * | 8/2005 | Terasawa et al. | 331/158 |
| 7,371,005 B1 | 5/2008 | Ahuja | |
| 2005/0040904 A1 * | 2/2005 | Sakurai | 331/176 |

OTHER PUBLICATIONS

Rose et al., "Development Status of the Microcomputer Compensated Crystal Oscillator", European Frequency Time Forum, Mar. 5-7, 1996 Conference Publication No. 418, pp. 190-195.*
Rakon Limited, New Zealand Provisional Specification entitled Frequency Reference Device and/or A Method of Providing a Temperature Compensated Frequency, Application Patent No. 264490, dated Sep. 20, 1994, pp. 1-23.
Schodowski, Blair, An External Compensated Crystal Oscillator Study, Northern Illinois University article, 1986, pp. 169-178.

* cited by examiner

*Primary Examiner* — Ryan Johnson
(74) *Attorney, Agent, or Firm* — Thomas, Kayden, Horstemeyer & Risley LLP.

(57) ABSTRACT

Aspects of a method and system for an energy efficient temperature sensing crystal integrated circuit (TSCIC) are provided. In this regard, one or more circuits in a temperature sensing crystal integrated circuit (TSCIC) may be configured to control power consumption of the TSCIC. The one or more circuits in the TSCIC may comprise a memory and a crystal. The one or more circuits in the TSCIC may be operable to generate an indication of temperature of the crystal. The one or more circuits in the TSCIC may be configured to control a current supplied to the crystal within the TSCIC, wherein the configuring is based on phase noise requirements of a signal generated by the crystal. Generation of the temperature indication may be enabled or disabled. The enabling or disabling may occur based on a rate of change of a temperature in the TSCIC.

16 Claims, 5 Drawing Sheets

METHOD AND SYSTEM FOR AN ENERGY EFFICIENT TEMPERATURE SENSING CRYSTAL INTEGRATED CIRCUIT

CROSS-REFERENCE TO RELATED APPLICATIONS/INCORPORATION BY REFERENCE

This patent application makes reference to, claims priority to and claims benefit from:
U.S. Provisional Patent Application Ser. No. 61/025,724 filed on Feb. 1, 2008; and
U.S. Provisional Patent Application Ser. No. 61/088,893 filed on Aug. 14, 2008.
This patent application also makes reference to:
U.S. patent application Ser. No. 12/364,046 filed on even date herewith, now U.S. Pat. No. 8,024,145;
U.S. patent application Ser. No. 12/364,117 filed on even date herewith, now U.S. Pat. No. 7,925,463; and
U.S. patent application Ser. No. 12/364,064 filed on even date herewith.
Each of the above stated applications is hereby incorporated herein by reference in its entirety.

FIELD OF THE INVENTION

Certain embodiments of the invention relate to signal processing. More specifically, certain embodiments of the invention relate to a method and system for an energy efficient temperature sensing crystal integrated circuit.

BACKGROUND OF THE INVENTION

A crystal oscillator is an electronic circuit that uses mechanical resonance of a vibrating crystal of piezoelectric material to create an electrical signal with a relatively precise frequency. This frequency is commonly used as a reference or clock signal for a variety of circuits. The vibration of the crystal may vary with temperature and/or over time. Such variations in the resonant frequency of the crystal may create instabilities or lead to other problems in an electronic system.

Further limitations and disadvantages of conventional and traditional approaches will become apparent to one of skill in the art, through comparison of such systems with some aspects of the present invention as set forth in the remainder of the present application with reference to the drawings.

BRIEF SUMMARY OF THE INVENTION

A system and/or method is provided for an energy efficient temperature sensing crystal integrated circuit, substantially as shown in and/or described in connection with at least one of the figures, as set forth more completely in the claims.

These and other advantages, aspects and novel features of the present invention, as well as details of an illustrated embodiment thereof, will be more fully understood from the following description and drawings.

DETAILED DESCRIPTION OF THE INVENTION

Certain embodiments of the invention may be found in a method and system for an energy efficient temperature sensing crystal integrated circuit. In various embodiments of the invention, one or more circuits in a temperature sensing crystal integrated circuit (TSCIC) may be configured to control power consumption of the TSCIC. The one or more circuits in the TSCIC may comprise a memory and a crystal. The one or more circuits in the TSCIC may be operable to generate an indication of temperature of the crystal. The one or more circuits in the TSCIC may be configured to control an output current and/or output voltage swing of one or more buffers within the TSCIC. The one or more circuits in the TSCIC may be configured to control a current supplied to the crystal within the TSCIC, wherein the configuring is based on phase noise requirements of a signal generated by the crystal. Generation of the temperature indication may be enabled or disabled. The enabling or disabling may occur based on a rate of change of a temperature in the TSCIC. The one or more circuits in the TSCIC may comprise one or both of a voltage regulator and a current regulator. The one or more circuits in the TSCIC may be configured to control power consumption of the TSCIC based on data stored in the memory. The one or more circuits may comprise circuitry operable to communicate over a communication bus. The one or more circuits in the TSCIC to control power consumption of the TSCIC is based on information received via the communication bus.

Figure 1:
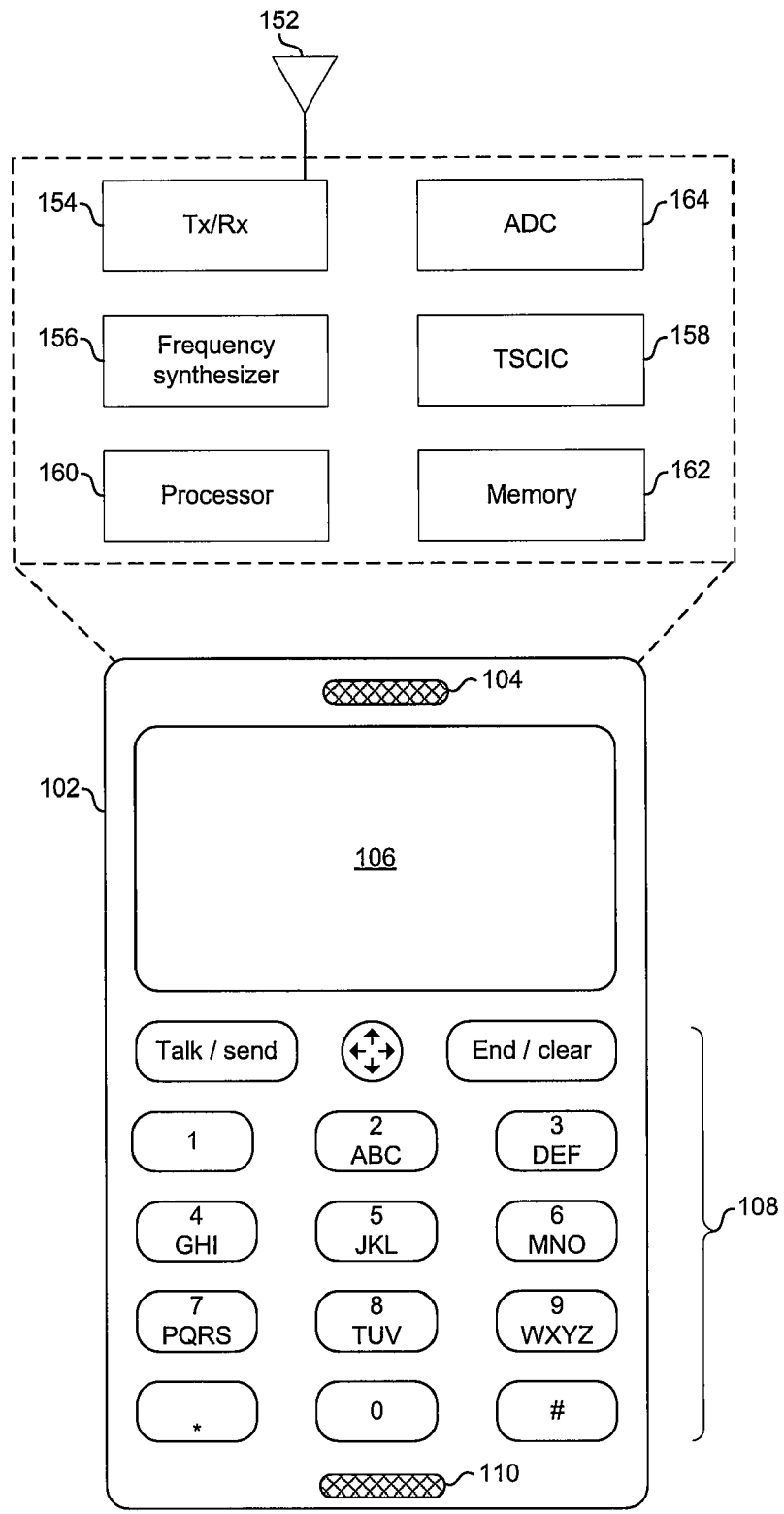
FIG. 1 is a block diagram illustrating an exemplary communication device comprising a temperature sensing crystal integrated circuit (TSCIC), in accordance with an embodiment of the invention.

FIG. 1 illustrates an exemplary communication device comprising a temperature sensing crystal integrated circuit (TSCIC), in accordance with an embodiment of the invention. Although a communication device is used for illustration, a TSCIC may be utilized in any type of electronic device. The communication device 102 may comprise an antenna 152, a transmitter and/or receiver module (Tx/Rx) 154, a processor 160, a memory 162, an analog to digital converter (ADC) 164, a display 106, user controls 108, a speaker 104, and a microphone 110.

The antenna 152 may be suitable for transmitting and/or receiving wireless signals. Although a single antenna is illustrated, the invention is not so limited. In this regard, the Tx/Rx 154 may utilize a common antenna for transmission and reception, may utilize different antennas for transmission and reception, and/or may utilize a plurality of antennas for transmission and/or reception.

The temperature sensing crystal integrated circuit (TSCIC) 158 may comprise a crystal and suitable logic, circuitry, and/or code that may be operable to generate one or more oscillating signals. Additionally, the TSCIC 158 may provide one or more signals that may enable determination of a frequency of the generated oscillating signals over time and/or temperature variations. Block diagrams of exemplary TSCICs are described below with respect to FIGS. 2A and 2B. The TSCIC 158 may be coupled to one or more external components to realize a crystal oscillator circuit. The TSCIC 158 may comprise one or more active and/or passive components coupled to a crystal to realize a crystal oscillator circuit. In such embodiments, the TSCIC 158 may generate an oscillating signal without external components.

In various embodiments of the invention, the TSCIC 158 may be configured based on performance and/or power requirements of the device 102. In this regard, the TSCIC 158 may be configured based on, for example, how often a temperature indication from the TSCIC 158 is desired or necessary, based on a drive strength and/or current swing required of signals output by the TSCIC 158, and/or based on temperature conditions in the device 102. The TSCIC 158 may also be configured based on applications running on the device 102, based on battery charge, based on features and/or capabilities of the device 102, and/or based on user input to the device 102. For example, the TSCIC 158 may be configured based on one or more wireless protocols utilized and/or supported by the device 102, an ability of the device 102 to operate in one or more power saving and/or high performance modes, applications that run on the device 102, and/or or accessories that may be communicatively coupled to the device 102. Additionally, the TSCIC 158 may be configured based on a hardware configuration of the device 102 which may, for example, account for make, model, and manufacturer of the device 102 and/or its components.

The frequency synthesizer 156 may comprise suitable logic, circuitry, and/or code that may be operable to generate one or more oscillating signals. The frequency synthesizer 156 may comprise active and/or passive components which may be coupled to xtal+ and xtal− terminals of the TSCIC 158 to realize a crystal oscillator circuit. The frequency synthesizer may comprise, for example, an integer-N PLL, fractional-N PLL, and/or a direct digital frequency synthesizer (DDFS). An output of the crystal oscillator circuit may be coupled to and provide a reference frequency to the PLL and/or DDFS.

In the exemplary embodiment of the invention depicted in FIG. 1, the frequency synthesizer 156 is shown as a separate block, however, the invention is not so limited. A portion, or all, of the frequency synthesizer 156 may be integrated into the TSCIC 158 and/or a portion, or all, of the frequency synthesizer 156 may be integrated into the Tx/Rx 154.

The Tx/Rx 154 may comprise suitable logic, circuitry, interfaces, and/or code that may be operable to transmit and/or receive signals utilizing a variety of wireless protocols. Exemplary communication wireless protocols utilized by the communication device 102 may comprise various cellular protocols, WiMAX, Bluetooth, Wi-Fi, DVB-H/S/T, GNSS, broadcast radio, and broadcast television. The Tx/Rx 154 may be operable to perform amplification, down-conversion, filtering, demodulation, and analog to digital conversion of received signals. The Tx/Rx 154 may be operable to perform amplification, up-conversion, filtering, modulation, and digital to analog conversion of signals to be transmitted. The Tx/Rx 154 may utilize one or more reference frequencies from the frequency synthesizer 156 and/or the TSCIC 158.

The processor 160 may comprise suitable logic, circuitry, interfaces, and/or code that may enable processing data and/or controlling operations of the communication device 102. The processor 160 may be enabled to provide and receive control signals to and from the various other portions of the communication device 102. The processor 160 may control transfers of data between various portions of the communication device 102. In this regard, the processor 160 may control reads and writes to memories and/or control registers in the communication device 102. Additionally, the processor 160 may enable execution of applications programs and/or code. The applications, programs, and/or code may enable, for example, processing of data, configuring portions of the communication device 102, and/or controlling operation of the communication device 102.

The memory 162 may comprise suitable logic, circuitry, and/or code that may enable storage or programming of information comprising parameters and/or code that may effectuate the operation of the communication device 102. Exemplary information stored in the memory 162 may comprise code to be executed by the processor 160, received data, and/or data to be presented, transmitted, and/or otherwise processed. In an exemplary embodiment of the invention, the memory 162 may store instructions which may be executed by the processor 160 to cause the processor 160 to issue commands and/or control signals to the TSCIC 158. In this regard, commands issued to the TSCIC 158 may cause the TSCIC 158 to be configured to manage power consumption. Additionally, in various embodiments of the invention, the memory 162 may store data characterizing behavior of the TSCIC 158.

The ADC 164 may comprise suitable logic, circuitry, interfaces, and/or code that may enable conversion of analog signals to a digital representation. In this regard, the ADC 164 may, for example, sample and quantize an analog signal at times specified by a sample clock. The sample clock may, for example, be generated based on a resonant frequency of a crystal or crystal oscillator within the TSCIC 158. The ADC 164 may generate digital signals of one or more serial or parallel bits.

The display 106 may comprise suitable logic, circuitry, interfaces and/or code that may be operable to provide visual information to, and/or enable interaction by, a user of the communication device 102. A graphical user interface may be presented via the display 106. The user interface of the mobile communication device 102 may be utilized to select which source or sources it may have a desire to receive content from. A frequency and/or wireless standard to be utilized for communication may be selected based on user input. Accordingly, based on such user input, the frequency synthesizer 156 and/or the Tx/Rx 154 may be adjusted and/or configured. Furthermore, a visual media content such as video, images, and text may be presented via the display 106.

The user controls 108 may be operable to enable user interaction with the communication device 102 to control services and/or content handled by the communication device 102. The user controls 108 may comprise, for example, a keypad, a keyboard, a roller ball, a multidirectional button, a scroll wheel, and/or a touch screen.

The speaker 104 may be operable to present audio information to a user. The speaker may present voice from a phone call and/or music or ringtones played back by the communication device.

The microphone 110 may be operable to convert acoustic signals into electronic signals. The microphone may enable a user to participate in a phone call and/or interact with the communication device via oral input.

In operation, the TSCIC 158 may be controlled via a state machine and/or commands from the processor 160. The various states of operation of the TSCIC 158 may enable managing power consumption of the TSCIC 158. In various states of operation of the TSCIC 158, generation of oscillating signals, temperature indications and/or calibration voltages may be enabled or disabled, and/or one or more portions of the TSCIC 158 may be disabled or powered down. Additionally, one or more circuits of the TSCIC 158 may be configured to control a drive strength, voltage swing, and/or frequency of one or more signals output by the TSCIC 158. Exemplary circuits of the TSCIC 158 that may be configured may comprise all or a portion of: one or more state registers, one or more control signals, one or more switching elements, one or more memory devices, one or more crystal oscillators, one or more buffers, one or more voltage regulators, and one or more communication bus interfaces. In various embodiments of the invention, the TSCIC 158 may be configured based on a state of operation of the device 102, based on a temperature and/or rate of change of temperature in the device 102, and/or based on the other components of the device 102 that interface with the TSCIC 158.

Figure 2A:
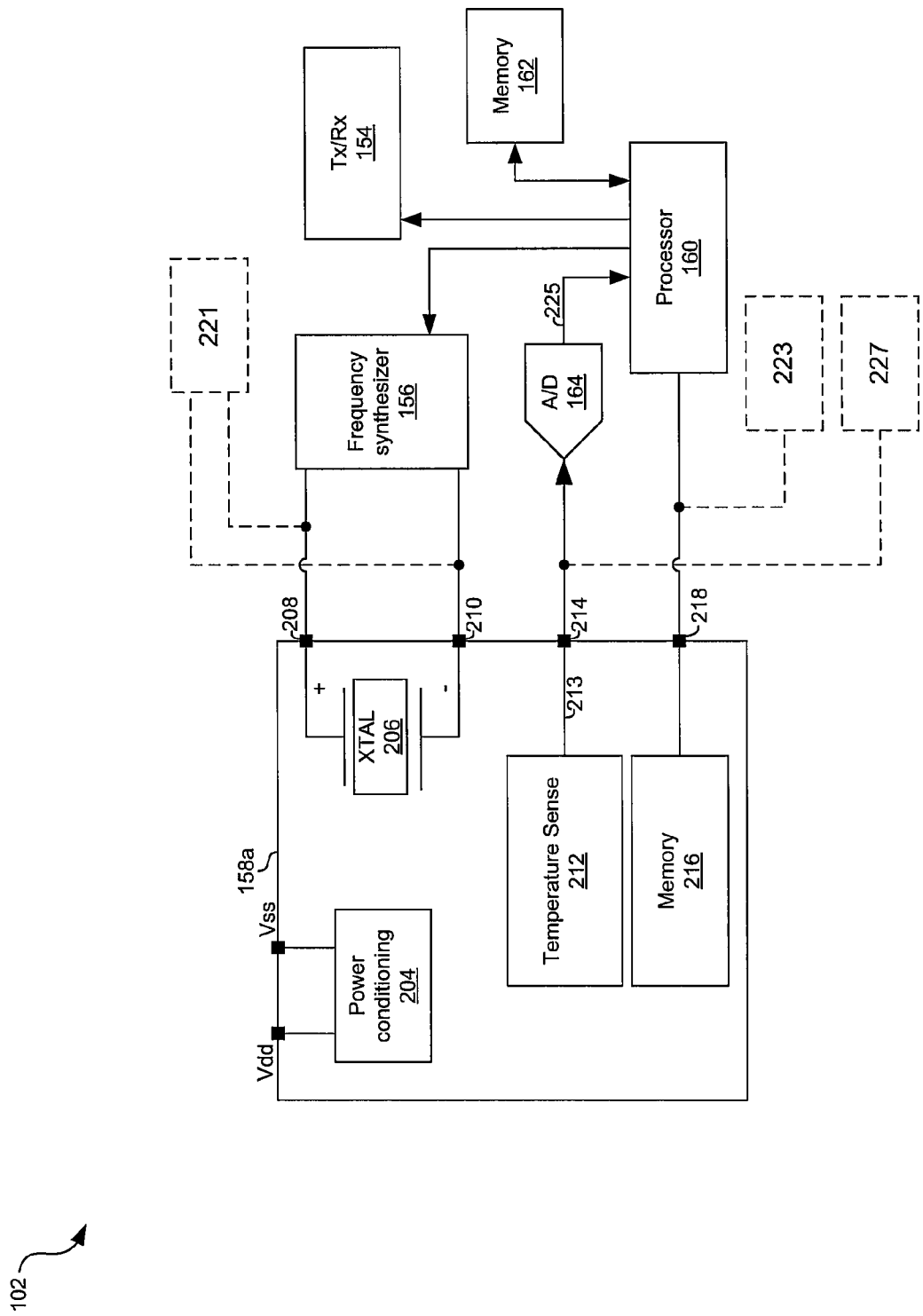
FIG. 2A is a block diagram illustrating an exemplary TSCIC, in accordance with an embodiment of the invention.

FIG. 2A is a block diagram illustrating an exemplary TSCIC, in accordance with an embodiment of the invention. Referring to FIG. 2A, there is shown TSCIC 158a and exemplary coupling between the various devices of the communication device 102. The TSCIC 158a may be an exemplary embodiment of the TSCIC 158 of FIG. 1. In an exemplary embodiment of the invention, the frequency synthesizer 156, the processor 160, the memory 162, and the ADC 164 may be integrated into a system on chip (SoC). The TSCIC 158a comprises a crystal 206, a temperature sensing module 212, and a memory 216. Additionally, in some embodiments of the invention, the TSCIC 158a may comprise a power conditioning block 204.

The frequency synthesizer 156, the processor 160, the memory 162, and the Tx/Rx 154 may be as described with respect to FIG. 1.

The ADC 164 may comprise suitable logic, circuitry, and/or code operable to digitize the signal 213 and generate the signal 225. Accordingly, the digital signal 225 may convey a digitized temperature indication or a digitized calibration voltage, depending on a configuration and/or state of the temperature sensing module 212.

The power conditioning module 204 may comprise suitable logic, circuitry, interfaces, and/or code that may be operable to generate one or more regulated voltages and/or currents from a supply voltage Vdd-Vss. In an exemplary embodiment of the invention, the voltage Vdd may be +1.8V and Vss may be 0V or GND. The power conditioning module 204 may be operable to reduce, increase, limit, filter, or otherwise condition the supply voltage to generate power rails for powering the temperature sensing module 212 and the memory 216. In this manner, the power conditioning module 204 may enable generation of clean, stable, and/or accurate temperature indications and calibration voltages.

In various embodiments of the invention, the power conditioning module 204 may be configurable to enable or disable power to components of the TSCIC 158a. For example, power to the temperature sensing module 212 may be disabled at times when temperature indications are not necessary or desired. Similarly, power to the memory 216 may be disabled when reads and/or writes to the memory 216 may not be necessary at a particular time and/or for a period of time. In various embodiments of the invention, the power conditioning module 204 may be operable to limit a current and/or voltage supplied to one or more components of the TSCIC 158a. For example, a drive strength and/or voltage swing of signals output via the terminals 214 and 218 may be controlled. Notwithstanding, in various embodiments of the invention the TSCIC 158a may be configurable to manage power consumption in other manners and may not comprise a power conditioning block 204.

The crystal 206 may comprise a piece of a piezoelectric material. A resonant frequency of the crystal 206 may be utilized to provide a reference frequency for an electronic circuit. The resonant frequency of the crystal 206 may depend on the material, the size, and the shape of the material, and may also depend on the temperature of the crystal. Accordingly, aspects of the invention may enable compensating for the temperature dependence of the resonant frequency of the crystal 206.

The memory 216 may comprise suitable logic, circuitry, interfaces, and/or code operable to store data. The memory 216 may be nonvolatile memory such as flash or fuse based memory or an EEPROM. The memory 216 may be read-only or may be writable. Accordingly, data, which may be compressed utilizing known or proprietary algorithms, may be stored in the memory 216 during production of the TSCIC 158a and may be remain valid during and subsequent to installation of the TSCIC 158a into a device such as the communication device 102 of FIG. 1. One or more flags in the memory 216 may indicate whether the memory 216 is writable and/or whether contents of the memory 216 have been modified. Additionally, the memory 216 may be powered down to conserve energy in the TSCIC 158a without losing stored information.

The memory 216 may store one or more data tables that may characterize the behavior of the TSCIC 158a over temperature. In this regard, the data tables may be indexed based on temperature indications measured and/or recorded at the terminal 214. Gain and offset errors introduced by the ADC 164 may cause a digitized temperature indication, output as signal 225, to differ from the temperature indication at terminal 214. Consequently, utilizing the digitized temperature indication as a table index, or to generate a table index, may result in sub-optimal frequency and/or frequency correction values being retrieved from the memory 216. Accordingly, aspects of the invention may enable compensating, utilizing calibration voltages output by the TSCIC 158a, for the gain and offset error introduced by the ADC 164.

The temperature sensing module 212 may comprise suitable logic, circuitry, interfaces, and/or code that may be operable to generate a signal 213 which may be indicative of a temperature of the crystal 206 or a calibration voltage. Whether signal 213 corresponds to a temperature or calibration voltage may depend, for example, on one or more control signals or a state of the temperature sensing module. The signal 213 may, for example, be a voltage that ranges from 0V to 1V over a temperature range of −30° C. to +75° C., with 0V and/or 1V being output as calibration voltages. Notwithstanding, the invention is not so limited and other voltage ranges and/or temperature ranges may be utilized without departing from the various embodiments of the invention.

In operation, one or more of the power conditioning module 204, the temperature sensing module 212, and the memory 216 may be configured to control power consumption in the TSCIC 158a. For example, the temperature sensing module 212 may be disabled or placed in a low(er) power state in instances that temperature indications or calibration voltages may not be necessary for a period of time.

The TSCIC 158a may be configured based on one or more control signals generated by, for example a state machine in the TSCIC 158a and/or the processor 160. The various components of the TSCIC 158a may be configured via, for example, a program stored in the memory 162, and/or in the memory 216, and executed by the processor 160. Additionally, the various components of the TSCIC 158a may be configured based on, for example, a mode of operation of the Tx/Rx 154, data received via the Tx/Rx 154, and a frequency to be generated by the frequency synthesizer 156.

Also, the TSCIC 158a may be configured based on components with which the TSCIC 158a interfaces. For example, voltage swing and/or drive strength output by the TSCIC 158a via the terminals 214 and 218 may be configured based on a type, manufacturer, and/or mode of operation of the ADC 164 and/or the processor 160.

Figure 2B:
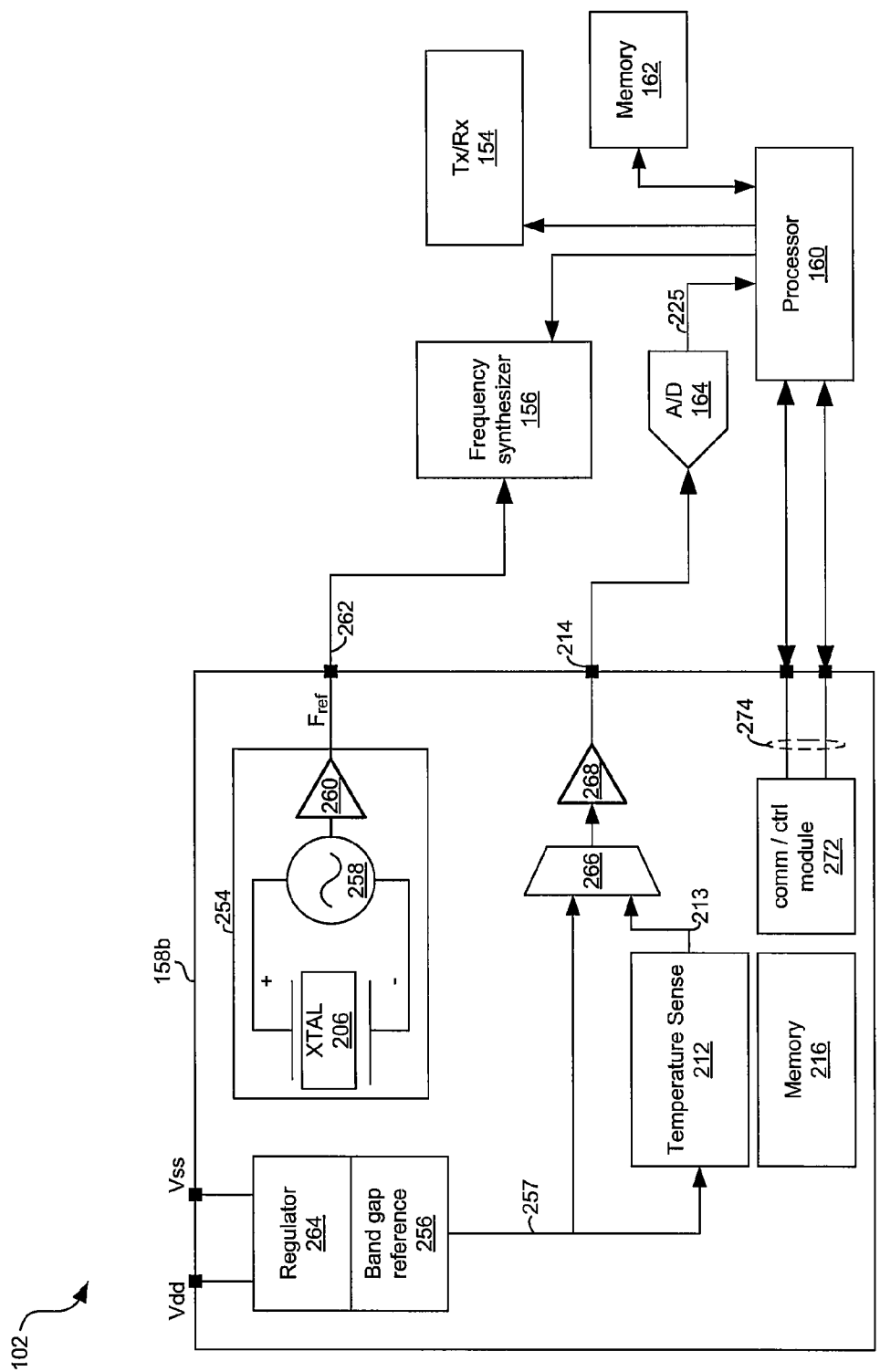
FIG. 2B is a block diagram illustrating another exemplary TSCIC, in accordance with an embodiment of the invention.

FIG. 2B is a block diagram illustrating another exemplary TSCIC, in accordance with an embodiment of the invention.

Referring to FIG. 2B, there is shown TSCIC 158*b* and exemplary coupling between the various devices of the communication device 102. The TSCIC 158*b* may be an exemplary embodiment of the TSCIC 158 of FIG. 1. The TSCIC 158*b* comprises a band gap reference module 256, a regulator 264, a crystal oscillator 254, a switching element 266, a buffer 268, a temperature sensing module 212, a memory 216, and a communication and control module 272.

The communication and control module 272 may comprise suitable logic, circuitry, interfaces, and/or code operable to communicate with external devices via the communication bus 274 and to control and/or configure the various components of the TSCIC 158*b*. With regard to communicating with external devices, the TSCIC 158*b* may comprise a communication bus interface which may be configured and/or disabled based on power consumption and/or performance requirements. With regard to the controlling and/or the configuring of various portions of the TSCIC 158*b*, the communication and control module 272 may comprise one or more registers for configuring the TSCIC 158*b* and/or indicating attributes of the TSCIC 158*b*. Additionally, the communication and control module 272 may be operable to generate one or more control signals for configuring the various components of the TSCIC 158*a* to control power consumption. In this regard, the communication and control module 272 may comprise state registers for effectuating operation of a state machine. Additionally and/or alternatively, the communication and control module 272 may be operable to receive commands via the communication bus 274 and configure the TSCIC 158*b* based on the received commands.

The communication and control module 272 may be operable to receive one or more signals from the various other components of the TSCIC 158*b* and to receive signals from other devices via the communication bus 274. The communication and control module 272 may be operable to generate one or more signals to control or configure components of the TSCIC 158*b*. In this regard, control signals generated may be in response to signals received from the other components of the TSCIC 158*b* and/or via the communication bus 274. The received signals may indicate conditions and/or parameters that may be utilized to control power consumption and/or performance of the TSCIC 158*b* and the control signals may configure the components of the TSCIC 158*b* accordingly. Also, the communication and control module 272 may be operable to transmit signals to other devices via the communication bus 274. In this regard, signals transmitted by the TSCIC 158*b* may be in response to signals received from the other components of the TSCIC 158*b* and/or via the communication bus 274. The transmitted signals may indicate power consumption of the TSCIC 158*b* and/or indicate parameters and/or conditions which may be utilized to make power management decisions. For example, power management conditions may be made based on the operating speed of the processor 160, available clock cycles of the processor 160, a frequency being generated by the frequency synthesizer 156, free space in the memory 162, applications and/or code being executed by the processor 160, and communication protocols and/or frequencies in use by the Tx/Rx 154.

The frequency synthesizer 156, the processor 160, the memory 162, the ADC 164, and the Tx/Rx 154 may be as described with respect to FIG. 1 and FIG. 2A. The temperature sensing module 212 and the memory 216 may be substantially as described with respect to FIG. 2A.

The band gap reference module 256 may be operable to output a reference voltage that may be approximately equal to the theoretical band gap of the material of which the TSCIC 158*b* is fabricated. For example, for silicon the band gap reference voltage 257 may be approximately 1.25V. The band gap reference 257 may be provided to the temperature sensing module 212 such that temperature indications and calibration voltages generated by the temperature sensing module 212 may be highly accurate and stable over a range of temperatures and over time. In one exemplary embodiment of the invention, the band gap reference module 256 may be a sub-module of the power conditioning module 204 described with respect to FIG. 1A.

The regulator 264 may comprise suitable logic, circuitry, interfaces, and/or code that may be operable to regulate one or more voltages and/or currents supplied to the crystal oscillator 254, the temperature sensing module 212, the memory 216, the switching element 266, the buffer 268, and/or the communication and control module 272. In this regard, the regulator 264 may be a linear or switching regulator and may filter, boost, buck, enable and disable, or otherwise condition the power in the device 102. In this manner, regulator 264 may enable generation of clean, stable, and accurate temperature indications and calibration voltages. In one exemplary embodiment of the invention, the regulator 264 may be a sub-module of the power conditioning module 204 described with respect to FIG. 1A. In various embodiments of the invention, the regulator 264 may be configurable to enable or disable and/or limit power to one or more components of the TSCIC 158*b*.

The crystal oscillator 254 may comprise an oscillator circuit 258 coupled to the crystal 206 and buffered by the buffer 260. The crystal 206 may be coupled as a load of the oscillator circuit 258 which may comprise one or more active and/or passive components. In various embodiments of the invention, the buffer 260 may be configured to control an output current and/or voltage swing of the buffer 260. In some embodiments of the invention, the phase noise of a signal generated by the crystal oscillator 254 may depend on the current supplied to the crystal oscillator 254. Accordingly, less current may be supplied to the crystal oscillator 254 when increased phase noise is to be tolerated. In various embodiments of the invention, a frequency output by the crystal oscillator 254 may be configured based on performance and/or power consumption requirements in the device 102. For example, the crystal oscillator 254 may be configured to output a low frequency signal when the device 102 is in a low power mode or sleep mode. In this regard, the processor 160, and/or other processor or devices coupled to the communication bus 274, may control a frequency of the signal 262 to manage power consumption and/or control a mode in which the communication device 102 is operating.

The switching element 266 may comprise suitable logic, circuitry, interfaces, and/or code operable to route either the band gap reference 257 or the signal 213 to the buffer 268 for conveyance to the ADC 164 via the terminal 214. The switching element 266 may be controlled via one or more signals from the communication and control module 272. In an exemplary embodiment of the invention, the switching element 266 may comprise a multiplexer. The output of the switching element 266 may be buffered by a buffer 268.

In operation, the communication and control module 272 may configure the TSCIC 158*b* to operate in one of a plurality of power consumption states based on, for example, commands received via the communication bus 274, a timer, information stored in memory 216, and/or one or more control signals from other components of the TSCIC 158*b*. In instances the TSCIC 158*b* is active and enabled to generate temperature indications, the TSCIC 158*b* may output a first calibration voltage, a second calibration voltage, and a temperature indication.

In various exemplary embodiment of the invention, the TSCIC 158b may be configured into one or more power states based on a state machine and/or based on commands received via the communication bus 274. For example, the communication and control module 272 may be operable to periodically or continually run a state machine that cycles the TSCIC 158b between a low(er) power state, in which the temperature sensing module 212 is disabled and no temperature indications or calibration voltages are output, and a high(er) power state, in which temperature indications and/or calibration voltages are output. In this regard, a frequency with which the state machine cycles through such states may be determined based on a rate of change of temperature of, or near, the crystal 206. The rate of change of temperature may be determined by the processor 160 and communicated to the communication and control module 272 via the communication bus 274. Similarly, based on received commands and/or control signals, the communication and control module may configure the TSCIC 158b into a low(er) power state, in which an output of the crystal oscillator 254 is reduced in frequency or disabled, or into a high(er) power state, in which an output of the crystal oscillator 254 is increased in frequency or enabled.

Figure 2C:
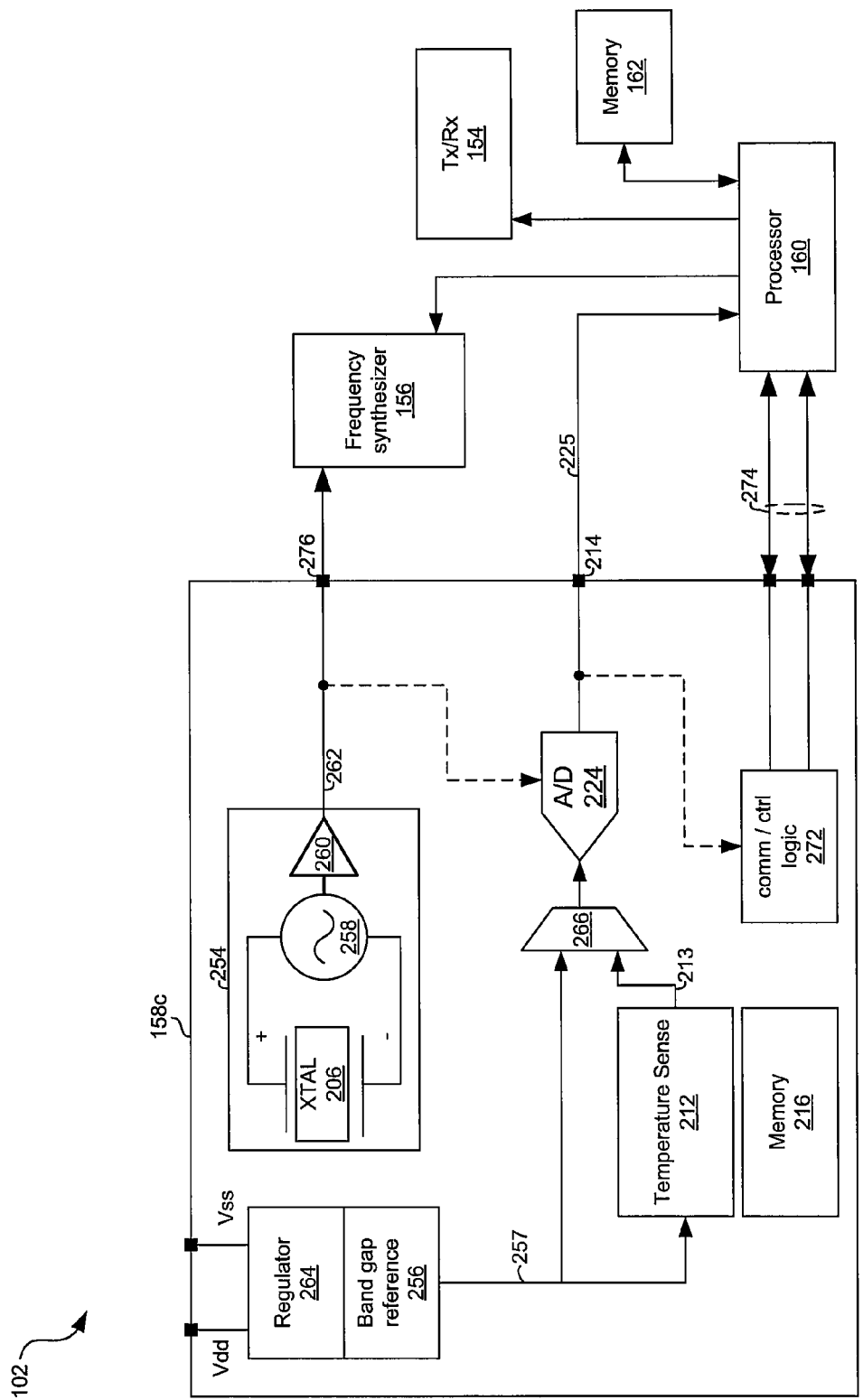
FIG. 2C is a block diagram illustrating another exemplary TSCIC, in accordance with an embodiment of the invention.

FIG. 2C is a block diagram illustrating another exemplary TSCIC, in accordance with an embodiment of the invention. Referring to FIG. 2C, there is shown TSCIC 158c and exemplary coupling between the various devices of the system 102. The TSCIC 158c may be an exemplary embodiment of the TSCIC 158 of FIG. 1. The TSCIC 158c may be similar to the TSCIC 158b described with respect to FIG. 2B but may additionally comprise an ADC 224.

The ADC 224 may comprise suitable logic, circuitry, and/or code that may enable conversion of analog signals to a digital representation. In this regard, the ADC 224 may sample and quantize, at times specified by a sample clock, an analog temperature indication signal 213 to generate a digital temperature indication 225. The digital temperature indication may comprise a plurality of bits conveyed serially or in parallel. In some embodiments of the invention, the digital temperature indication may be the output of a delta-sigma modulator. The output 225 of the ADC 224 may be conveyed to external devices via the terminal 214 and/or via the communication bus 274. In various embodiments of the invention, the ADC 224 may be enabled and/or disabled based on performance and/or power consumption conditions and/or requirements. In various embodiments of the invention, a current and/or voltage swing of an output of the ADC 224 may be configured based on power and/or performance conditions and/or requirements. In various embodiments of the invention, a sample rate of the ADC 224 may be configured based on performance and/or power consumption conditions and/or requirements. The ADC 224 may be configured by the communication and control module 272 based on signals received over the communication bus 274 and/or a state machine.

In operation, the TSCIC 158c may output a first digital calibration voltage, a second digital calibration voltage, and a digital temperature indication. In some embodiments of the invention, the digital calibration voltages and digital temperature indication may be output sequentially, in any desired sequence, via the terminal 214. In some embodiments of the invention, the digital calibration voltages and digital temperature indication may be communicated, via the communication and control module 272, over the communication bus 274. In this regard, the digital calibration voltages and digital temperature indication may be communicated in a sequence of messages, separately in individual messages, or together in a single message. The rate at which temperature indications and/or calibration voltages are generated and/or digitized may be configured based on performance and/or power consumption requirements.

Upon power up, the crystal oscillator 254 may begin generating an oscillating signal 262, where a frequency of the signal 262 may depend on performance and/or power consumption requirements. The frequency synthesizer 156 may receive the oscillating signal 262 via the terminal 276. In some embodiments of the invention, the signal 262 generated by the crystal oscillator 254 may be utilized as a sampling clock of the ADC 224 or may be utilized to generate a sampling clock of the ADC 224.

Figure 3:
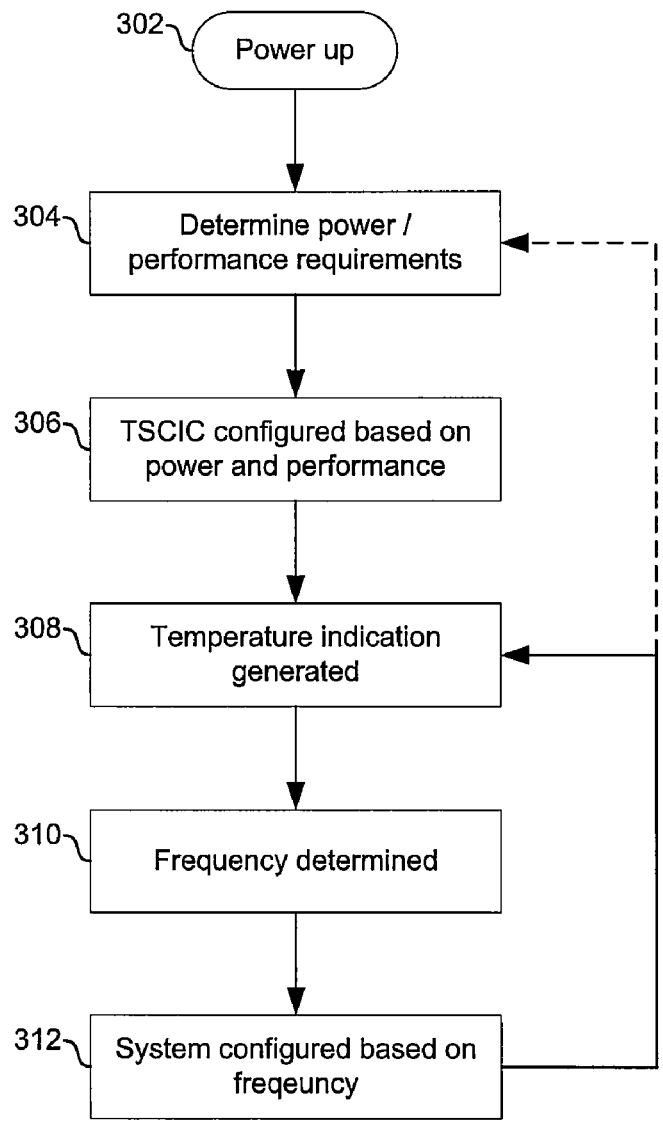
FIG. 3 is a flow chart illustrating exemplary steps for power management in a TSCIC, in accordance with an embodiment of the invention.

FIG. 3 is a flow chart illustrating exemplary steps for power management in a TSCIC, in accordance with an embodiment of the invention. The exemplary steps are described with reference to the device 102 of FIG. 2C. Referring to FIG. 3, the exemplary steps may begin with step 302 when the TSCIC 158c may power up and undergo a power-on-reset. Subsequent to step 302, the exemplary steps may advance to step 304.

In step 304, the processor 160 may determine performance and power requirements of the TSCIC 158c. For example, the processor 160 may determine required timing, drive strength, and/or voltage swings for signals output by TSCIC 158c and may generate commands to configure the buffers 260 and 268 accordingly. In this regard, the buffers may be configured to optimize power consumption while achieving the required signal characteristics. The appropriate signal characteristics may be determined based on a CHIP_ID stored in the memory 216. Additionally, the processor 160 may determine a frequency with which temperature indications may be required from the TSCIC 158c and generate one or more commands and/or signals to configure the TSCIC 158c accordingly. Subsequent to step 304, the exemplary steps may advance to step 306.

In step 306, the TSCIC 158c may be configured to optimize power consumption vs. performance based on commands and/or control signals received from the processor 160 and based on a value of one or more parameters and/or state variables within the TSCIC 158c. In this regard, parameters and/or state variables may be configured, for example, by a designer of the device 102, a user of the device 102, and/or one or more applications running on the device. Subsequent to power up and initialization, the TSCIC 158c may begin operation. Accordingly, the exemplary steps may advance to step 308.

In step 308, the temperature sensing module 212 may generate a temperature indication which may be digitized by the ADC 224 and output via the terminal 214 and/or the communication bus 274. Subsequent to step 308, the exemplary steps may advance to step 310.

In step 310, the frequency of the crystal 206 may be determined based on the temperature indication generated in step 308 and based on data and/or algorithms retrieved from the memory 216 and/or downloaded over a network. Subsequent to step 310, the exemplary steps may advance to step 312.

In step 312, one or more circuits of the communication device 102 may be configured based on the determination in step 310. In this manner, the system 102 may be configured to compensate for variations in behavior of the TSCIC 158c over temperature. Subsequent to step 312, the exemplary steps may return to step 308 in which a subsequent temperature indication may be generated. Alternatively, the exemplary steps may return to step 304 if one or more parameters and/or requirements associated with power consumption and/or performance has changed or is required or desired to change.

Various aspects of a method and system for an energy efficient temperature sensing crystal integrated circuit (TSCIC) are provided. In an exemplary embodiment of the invention, one or more circuits in a temperature sensing crystal integrated circuit (TSCIC) 158*b* may be configured to control power consumption of the TSCIC 158*b*. The one or more circuits in the TSCIC 158*b* may comprise a memory 216 and a crystal 206. The one or more circuits in the TSCIC 158*b* may be operable to generate an indication of temperature of the crystal 206. The one or more circuits in the TSCIC 158*b* may be configured to control an output current and/or an output voltage swing of one or more buffers, such as 260 and 268, within the TSCIC 158*b*. The one or more circuits in the TSCIC 158*b* may be configured to control a current supplied to the crystal within the TSCIC 158*b*, wherein the configuring is based on phase noise requirements of a signal generated by the crystal 206. Generation of the temperature indication may be enabled or disabled. The enabling or disabling may occur based on a rate of change of a temperature in the TSCIC. The one or more circuits in the TSCIC 158*b* may comprise one or both of a voltage regulator and a current regulator, such as the regulator 264. The one or more circuits in the TSCIC 158*b* may be configured to control power consumption of the TSCIC 158*b* based on data stored in the memory 216. The one or more circuits may comprise circuitry, such as the communication and control module 272 operable to communicate over a communication bus 274. The one or more circuits in the TSCIC 158*b* may be configured to control power consumption of the TSCIC based on information received via the communication bus 274.

Another embodiment of the invention may provide a machine and/or computer readable storage and/or medium, having stored thereon, a machine code and/or a computer program having at least one code section executable by a machine and/or a computer, thereby causing the machine and/or computer to perform the steps as described herein for an energy efficient temperature sensing crystal integrated circuit.

Accordingly, the present invention may be realized in hardware, software, or a combination of hardware and software. The present invention may be realized in a centralized fashion in at least one computer system, or in a distributed fashion where different elements are spread across several interconnected computer systems. Any kind of computer system or other apparatus adapted for carrying out the methods described herein is suited. A typical combination of hardware and software may be a general-purpose computer system with a computer program that, when being loaded and executed, controls the computer system such that it carries out the methods described herein.

The present invention may also be embedded in a computer program product, which comprises all the features enabling the implementation of the methods described herein, and which when loaded in a computer system is able to carry out these methods. Computer program in the present context means any expression, in any language, code or notation, of a set of instructions intended to cause a system having an information processing capability to perform a particular function either directly or after either or both of the following: a) conversion to another language, code or notation; b) reproduction in a different material form.

While the present invention has been described with reference to certain embodiments, it will be understood by those skilled in the art that various changes may be made and equivalents may be substituted without departing from the scope of the present invention. In addition, many modifications may be made to adapt a particular situation or material to the teachings of the present invention without departing from its scope. Therefore, it is intended that the present invention not be limited to the particular embodiment disclosed, but that the present invention will include all embodiments falling within the scope of the appended claims.

What is claimed is:

1. A method for signal processing, the method comprising:
configuring one or more circuits in a temperature sensing crystal integrated circuit (TSCIC) comprising a memory and a crystal to control power consumption of said TSCIC, wherein:
said one or more circuits in said TSCIC are operable to generate an indication of temperature of said crystal; and
enabling or disabling said generation of said indication of temperature, wherein said enabling or said disabling of said generation of said indication occurs based on a rate of change of said temperature.

2. The method according to claim 1, comprising configuring said one or more circuits in said TSCIC to control an output current of one or more buffers within said TSCIC.

3. The method according to claim 1, comprising configuring said one or more circuits in said TSCIC to control an output voltage swing of one or more buffers within said TSCIC.

4. The method according to claim 1, comprising configuring said one or more circuits in said TSCIC to control a current supplied to said crystal within said TSCIC, wherein said configuring is based on phase noise requirements of a signal generated by said crystal.

5. The method according to claim 1, wherein said one or more circuits comprise one or both of a voltage regulator and a current regulator.

6. The method according to claim 1, comprising configuring said one or more circuits in said TSCIC to control power consumption of said TSCIC based on data stored in said memory.

7. The method according to claim 1, wherein said one or more circuits comprise circuitry operable to communicate over a communication bus.

8. The method according to claim 7, comprising configuring said one or more circuits in said TSCIC to control power consumption of said TSCIC based on information received via said communication bus.

9. A system for signal processing, the system comprising:
one or more circuits in a temperature sensing crystal integrated circuit, wherein:
said one or more circuits in said TSCIC comprising a memory and a crystal are operable to control power consumption of said TSCIC; and
said one or more circuits in said TSCIC are operable to generate an indication of temperature of said crystal, wherein said one or more circuits are configured to enable or disable said generation of said indication of temperature, wherein said one or more circuits are configured based on a rate of change of said temperature.

10. The system according to claim 9, wherein said one or more circuits comprise one or more buffers and an output current of said one or more buffers is configurable.

11. The system according to claim 9, wherein said one or more circuits one or more buffers and an output voltage swing of said one or more buffers is configurable.

12. The system according to claim 9, wherein said one or more circuits are configured to control a current supplied to said crystal within said TSCIC, wherein said configuring is based on phase noise requirements of a signal generated by said crystal.

13. The system according to claim 9, wherein said one or more circuits comprise one or both of a voltage regulator and a current regulator.

14. The system according to claim 9, wherein said one or more circuits are configured to control power consumption of said TSCIC based on data stored in said memory.

15. The system according to claim 9, wherein said one or more circuits are operable to communicate over a communication bus.

16. The system according to claim 15, wherein said one or more circuits are configured to control power consumption of said TSCIC based on information received via said communication bus.

* * * * *